United States Patent
Ershov et al.

(10) Patent No.: US 8,785,892 B2
(45) Date of Patent: Jul. 22, 2014

(54) LASER-PRODUCED-PLASMA EUV LIGHT SOURCE

(75) Inventors: Alexander I. Ershov, Escondido, CA (US); Igor V. Fomenkov, San Diego, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 13/493,871

(22) Filed: Jun. 11, 2012

(65) Prior Publication Data

US 2012/0305810 A1 Dec. 6, 2012

Related U.S. Application Data

(63) Continuation of application No. 12/658,133, filed on Feb. 2, 2010, now Pat. No. 8,198,615, which is a continuation of application No. 11/897,644, filed on Aug. 31, 2007, now Pat. No. 7,655,925.

(51) Int. Cl.
  *H05H 1/00* (2006.01)
  *H05H 1/24* (2006.01)
  *G21K 5/04* (2006.01)

(52) U.S. Cl.
  USPC .............. 250/504 R; 250/493.1; 250/365; 422/24; 422/121

(58) Field of Classification Search
  USPC .............. 250/504 R, 365, 493.1; 422/24, 121
  See application file for complete search history.

(56) References Cited

U.S. PATENT DOCUMENTS

| | | | |
|---|---|---|---|
| 4,251,781 A | 2/1981 | Sutter, Jr. | |
| 6,133,577 A | 10/2000 | Gutowski et al. | |
| 6,285,743 B1 | 9/2001 | Kondo et al. | |
| 6,549,551 B2 | 4/2003 | Ness et al. | |
| 6,567,450 B2 | 5/2003 | Myers et al. | |
| 6,625,191 B2 | 9/2003 | Knowles et al. | |
| 6,690,764 B2 | 2/2004 | Kondo | |
| 7,087,914 B2 | 8/2006 | Akins et al. | |

(Continued)

FOREIGN PATENT DOCUMENTS

| | | |
|---|---|---|
| EP | 1434095 A1 | 6/2004 |
| JP | 2007-220949 A | 8/2007 |
| WO | 2008/105989 A2 | 9/2008 |

OTHER PUBLICATIONS

European Office Action, mailed Oct. 11, 2012 in related application European Patent Application No. 08 795 347.7, 10 pages.

(Continued)

*Primary Examiner* — Nikita Wells
(74) *Attorney, Agent, or Firm* — Martine Penilla Group, LLP

(57) ABSTRACT

Devices and corresponding methods of use are described herein that may include an enclosing structure defining a closed loop flow path and a system generating a plasma at a plasma site, e.g. laser produced plasma system, where the plasma site may be in fluid communication with the flow path. For the device, a gas may be disposed in the enclosing structure which may include an ion-stopping buffer gas and/or an etchant. A pump may be provided to force the gas through the closed loop flow path. One or more heat exchangers removing heat from gas flowing in the flow path may be provided. In some arrangements, a filter may be used to remove at least a portion of a target species from gas flowing in the flow path.

12 Claims, 9 Drawing Sheets

FIG.5

(56) References Cited

U.S. PATENT DOCUMENTS

| | | |
|---|---|---|
| 7,095,038 B2 | 8/2006 | Barthod et al. |
| 7,126,143 B2 | 10/2006 | Klein et al. |
| 7,136,141 B2 | 11/2006 | Bakker |
| 7,164,144 B2 | 1/2007 | Partlo et al. |
| 7,196,342 B2 | 3/2007 | Ershov et al. |
| 7,217,940 B2 | 5/2007 | Partlo et al. |
| 7,217,941 B2 | 5/2007 | Rettig et al. |
| 7,230,258 B2 | 6/2007 | Ruzic et al. |
| 7,233,013 B2 | 6/2007 | Hergenhan et al. |
| 7,307,263 B2 | 12/2007 | Bakker et al. |
| 7,365,350 B2 | 4/2008 | Tran et al. |
| 7,468,521 B2 | 12/2008 | Klunder et al. |
| 7,491,954 B2 | 2/2009 | Bykanov et al. |
| 7,655,925 B2 * | 2/2010 | Bykanov et al. ............... 250/436 |
| 7,671,349 B2 * | 3/2010 | Bykanov et al. ........... 250/504 R |
| 7,927,971 B2 | 4/2011 | Tamura et al. |
| 8,035,092 B2 * | 10/2011 | Bykanov et al. ........... 250/504 R |
| 8,198,615 B2 * | 6/2012 | Bykanov et al. ........... 250/504 R |
| 2003/0147499 A1 | 8/2003 | Kondo |
| 2005/0045829 A1 | 3/2005 | Ito et al. |
| 2006/0163500 A1 | 7/2006 | Inoue et al. |
| 2006/0192151 A1 | 8/2006 | Bowering et al. |
| 2006/0193997 A1 | 8/2006 | Bykanov |
| 2006/0289806 A1 | 12/2006 | Simmons et al. |
| 2007/0018119 A1 | 1/2007 | Yabuta et al. |
| 2007/0018122 A1 | 1/2007 | Ershov et al. |
| 2007/0023705 A1 | 2/2007 | Partlo et al. |
| 2007/0029512 A1 | 2/2007 | Bowering et al. |
| 2007/0069162 A1 | 3/2007 | Banine et al. |
| 2008/0099699 A1 | 5/2008 | Yabuta et al. |
| 2008/0179548 A1 | 7/2008 | Bykanov et al. |
| 2008/0237498 A1 | 10/2008 | MacFarlane et al. |
| 2009/0057567 A1 | 3/2009 | Bykanov et al. |
| 2009/0127479 A1 | 5/2009 | Hosokai et al. |
| 2009/0267005 A1 | 10/2009 | Bykanov et al. |
| 2009/0314967 A1 | 12/2009 | Morya et al. |
| 2010/0025600 A1 | 2/2010 | Chavez et al. |
| 2010/0032590 A1 | 2/2010 | Bykanov et al. |

OTHER PUBLICATIONS

Greenwood, N.N.; Earnshaw, A.; Chemistry of the Elements, 1997, Elsevier; 2nd Edition, pp. 374-388.

* cited by examiner

LASER-PRODUCED-PLASMA EUV LIGHT SOURCE

This application is a continuation of U.S. application Ser. No. 12/658,133, filed on Feb. 2, 2010 now U.S Pat. No. 8,198,615, which is a continuation of U.S. application Ser. No. 11/897,644, filed on Aug. 31, 2007, and issued as U.S. Pat. No. 7,655,925 on Feb. 2, 2010, both of which are incorporated herein by reference in their entirety.

This application is related to co-pending U.S. application Ser. No. 11/358,992 filed on Feb. 21, 2006, entitled LASER PRODUCED PLASMA EUV LIGHT SOURCE, co-pending U.S. application Ser. No. 11/827,803 filed on Jul. 13, 2007, entitled LASER PRODUCED PLASMA EUV LIGHT SOURCE HAVING A DROPLET STREAM PRODUCED USING A MODULATED DISTURBANCE WAVE, co-pending U.S. application Ser. No. 11/786,145 filed on Apr. 10, 2007, entitled LASER PRODUCED PLASMA EUV LIGHT SOURCE, co-pending U.S. application Ser. No. 11/107,535 filed on Apr. 14, 2005, entitled EXTREME ULTRAVIOLET LIGHT SOURCE, which is a continuation of U.S. application Ser. No. 10/409,254 filed on Apr. 8, 2003, entitled EXTREME ULTRAVIOLET LIGHT SOURCE, co-pending U.S. application Ser. No. 11/358,988 filed on Feb. 21, 2006, entitled LASER PRODUCED PLASMA EUV LIGHT SOURCE WITH PRE-PULSE, co-pending U.S. application Ser. No. 11/067,124 filed on Feb. 25, 2005, entitled METHOD AND APPARATUS FOR EUV PLASMA SOURCE TARGET DELIVERY, co-pending U.S. application Ser. No. 11/174,443 filed on Jun. 29, 2005, entitled LPP EUV PLASMA SOURCE MATERIAL TARGET DELIVERY SYSTEM, co-pending U.S. application Ser. No. 11/358,992 filed on Feb. 21, 2006, entitled LASER PRODUCED PLASMA EUV LIGHT SOURCE, co-pending U.S. application Ser. No. 11/174,299 filed on Jun. 29, 2005, and entitled, LPP EUV LIGHT SOURCE DRIVE LASER SYSTEM, co-pending U.S. application Ser. No. 11/406,216 filed on Apr. 17, 2006 entitled ALTERNATIVE FUELS FOR EUV LIGHT SOURCE, co-pending U.S. application Ser. No. 11/580,414 filed on Oct. 13, 2006 entitled, DRIVE LASER DELIVERY SYSTEMS FOR EUV LIGHT SOURCE, co-pending U.S. application Ser. No. 11/644,153 filed on Dec. 22, 2006 entitled, LASER PRODUCED PLASMA EUV LIGHT SOURCE, co-pending U.S. application Ser. No. 11/505,177 filed on Aug. 16, 2006, entitled EUV OPTICS, co-pending U.S. application Ser. No. 11/452,501 filed on Jun. 14, 2006 entitled DRIVE LASER FOR EUV LIGHT SOURCE, U.S. Pat. No. 6,928,093, issued to Webb, et al. on Aug. 9, 2005, entitled LONG DELAY AND HIGH TIS PULSE STRETCHER, U.S. application Ser. No. 11/394,512, filed on Mar. 31, 2006 and titled CONFOCAL PULSE STRETCHER, U.S. application Ser. No. 11/138,001 filed on May 26, 2005 and titled SYSTEMS AND METHODS FOR IMPLEMENTING AN INTERACTION BETWEEN A LASER SHAPED AS A LINE BEAM AND A FILM DEPOSITED ON A SUBSTRATE, and U.S. application Ser. No. 10/141,216, filed on May 7, 2002, now U.S. Pat. No. 6,693,939, and titled, LASER LITHOGRAPHY LIGHT SOURCE WITH BEAM DELIVERY, U.S. Pat. No. 6,625,191 issued to Knowles et al on Sep. 23, 2003 entitled VERY NARROW BAND, TWO CHAMBER, HIGH REP RATE GAS DISCHARGE LASER SYSTEM, U.S. application Ser. No. 10/012,002, U.S. Pat. No. 6,549,551 issued to Ness et al on Apr. 15, 2003 entitled INJECTION SEEDED LASER WITH PRECISE TIMING CONTROL, U.S. application Ser. No. 09/848,043, and U.S. Pat. No. 6,567,450 issued to Myers et al on May 20, 2003 entitled VERY NARROW BAND, TWO CHAMBER, HIGH REP RATE GAS DISCHARGE LASER SYSTEM, U.S. application Ser. No. 09/943,343, co-pending U.S. application Ser. No. 11/509,925 filed on Aug. 25, 2006, entitled SOURCE MATERIAL COLLECTION UNIT FOR A LASER PRODUCED PLASMA EUV LIGHT SOURCE, the entire contents of each of which are hereby incorporated by reference herein.

FIELD

The present disclosure relates to extreme ultraviolet ("EUV") light sources that provide EUV light from a plasma that is created from a target material and collected and directed to an intermediate region for utilization outside of the EUV light source chamber, e.g. by a lithography scanner/stepper.

BACKGROUND

Extreme ultraviolet light, e.g., electromagnetic radiation having wavelengths of around 50 nm or less (also sometimes referred to as soft x-rays), and including light at a wavelength of about 13.5 nm, can be used in photolithography processes to produce extremely small features in substrates, e.g., silicon wafers.

Methods to produce EUV light include, but are not necessarily limited to, converting a material into a plasma state that has at least one element, e.g., xenon, lithium or tin, with one or more emission lines in the EUV range. In one such method, often termed laser produced plasma ("LPP") the required plasma can be produced by irradiating a target material, such as a droplet, stream or cluster of material having the required line-emitting element, with a laser beam.

One particular LPP technique involves irradiating a target material droplet with one or more high energy pulses. In this regard, $CO_2$ lasers may present certain advantages as a drive laser producing high energy pulses in an LPP process. This may be especially true for certain target materials such as molten tin droplets. For example, one advantage may include the ability to produce a relatively high conversion efficiency, for example, the ratio of output EUV in-band power to drive laser input power.

In more theoretical terms, LPP light sources generate EUV radiation by depositing laser energy into a source element, such as xenon (Xe), tin (Sn) or lithium (Li), creating a highly ionized plasma with electron temperatures of several 10's of eV. The energetic radiation generated during de-excitation and recombination of these ions is emitted from the plasma in all directions. In one common arrangement, a near-normal-incidence mirror (often termed a "collector mirror") is positioned at a distance from the plasma to collect, direct (and in some arrangements, focus) the light to an intermediate location, e.g., focal point. The collected light may then be relayed from the intermediate location to a set of scanner optics and ultimately to a wafer. In a typical setup, the EUV light must travel within the light source about 1-2 m from the plasma to the intermediate location, and as a consequence, it may be advantageous, in certain circumstances, to limit the atmosphere in the light source chamber to gases having relatively low absorptance of in-band EUV light.

For EUV light sources designed for use in high volume manufacturing (HVM) environments, e.g. exposing 100 wafers per hour or more, the lifetime of the collector mirror can be a critical parameter affecting efficiency, downtime, and ultimately, cost. During operation, debris are generated as a by-product of the plasma which can degrade the collector mirror surface. These debris can be in the form of high-energy ions, neutral atoms and clusters of target material. Of these three types of debris, the most hazardous for the collector mirror coating is typically the ion flux.

Generally, for the configuration described above, the amount of neutral atoms and clusters from the droplet target impinging onto the collector may be small since most of the target material moves in a direction pointing away from the collector surface, (i.e., in the direction of the laser beam). In the absence of debris mitigation and/or collector cleaning techniques, the deposition of target materials and contaminants, as well as sputtering of the collector multilayer coating and implantation of incident particles can reduce the reflectivity of the mirror substantially. In this regard, co-pending, co-owned U.S. application Ser. No. 11/786,145 filed on Apr. 10, 2007, entitled LASER PRODUCED PLASMA EUV LIGHT SOURCE, discloses a device in which a flowing buffer gas such as hydrogen at pressures at or above about 100 mTorr is used in the chamber to slow ions in the plasma to below about 30 eV before the ions reach the collector mirror, which is typically located about 15 cm from the plasma.

It is currently envisioned that about 100 W of EUV power, or more, will need to be delivered to a scanner/stepper to allow for efficient high volume EUV photolithography. To obtain this output power, a 5-20 kW drive laser, e.g. $CO_2$ laser, may be used to irradiate a source material such as a stream of tin droplets. Of the 5-20 kW of power delivered within the EUV light source chamber, calculations indicate that about 20%-80% of this power may be transferred to a buffer gas in the chamber.

SUMMARY

With the above in mind, Applicants disclose a Gas Management System for a Laser-Produced-Plasma EUV Light Source, and corresponding methods of use.

In a first aspect, a device is described herein that may comprise an enclosing structure defining a closed loop flow path; a system generating a plasma at a plasma site, the site being in fluid communication with the flow path; a gas disposed in the enclosing structure; a pump forcing the gas through the closed loop flow path; a heat exchanger removing heat from gas flowing in the flow path; and a filter removing at least a portion of a target species from gas flowing in the flow path.

In one application of this aspect, the plasma may include tin and the filter may remove a compound selected from the group of compounds comprising tin hydrides, tin oxides, tin bromides and combinations thereof.

In one embodiment of this aspect, the enclosing structure may be formed with an inlet and an outlet, and the device may further comprise a gas source connected to the inlet and a conditioner connected to the outlet to condition gas exiting the enclosing structure, the conditioner being selected from the group of conditioners consisting of a gas dilution mechanism, a scrubber or a combination thereof.

In one implementation of this aspect, the enclosing structure may comprise a vessel in fluid communication with a guideway, the guideway being external to the vessel.

In another aspect, a device is described herein which may comprise an EUV reflective optic formed with a through-hole; an enclosing structure defining a closed loop flow path passing through the through-hole; a system generating a plasma at a plasma site, the site being in fluid communication with the flow path; a gas disposed in the enclosing structure; and a pump forcing the gas through the closed loop flow path.

In one implementation of this aspect, the enclosing structure may comprise a vessel in fluid communication with a guideway, the guideway being external to the vessel.

In one embodiment of this aspect, the device may further comprise a gas flow restriction member establishing first and second compartments in the vessel, the closed-loop flow path extending from the first compartment through the through-hole formed in the optic to the second compartment, and in a particular embodiment, the optic may be formed with an edge, the vessel may formed with a vessel wall and the restriction member may be disposed between the collector edge and vessel wall to restrict flow therebetween.

In one arrangement of this aspect, the gas may pass through a temperature controlled, multi-channel structure prior to reaching the pump.

In another aspect, a device is described herein which may comprise an enclosing structure; a system generating a plasma producing EUV radiation at a plasma site in the enclosing structure and releasing at least 5 kW of power into the chamber; a gas disposed in the chamber at a pressure exceeding 100 mTorr at at least one location in the enclosing structure; and a closed-loop circulation system circulating gas through the enclosing structure, the circulation system including at least one heat exchanger cooling the gas on each pass through the loop.

In one implementation of this aspect, the gas may flow through the closed-loop circulation system at an average flow rate greater than 50 standard liters per minute.

In one embodiment of this aspect, the enclosing structure may comprise a vessel and the heat exchanger may be positioned in the vessel.

In one arrangement of this aspect, the heat exchanger may be a temperature controlled, multi-channel structure.

In one embodiment of this aspect, the closed-loop circulation system may maintain an average gas temperature of less than 1000 degrees Celsius in the system.

In another aspect, a device is described herein which may comprise an enclosing structure; a system generating a plasma at a plasma site in the enclosing structure, the plasma producing EUV radiation and ions exiting the plasma; an optic distanced from the site by a distance, d; a gas disposed between the plasma and optic, the gas establishing a gas number density sufficient to operate over the distance, d, to reduce ion energy below 100 eV before the ions reach the optic; and a closed-loop circulation system circulating gas through the enclosing structure, the circulation system including at least one heat exchanger removing heat from gas flowing through the loop.

In one implementation of this aspect, the optic may direct EUV radiation to an intermediate location and the device may further comprise a multi-channel structure disposed between the plasma site and the intermediate location.

In one embodiment of this aspect, the gas may comprise greater than 50 percent hydrogen by volume.

In one arrangement of this aspect, the gas may comprise an etchant gas selected from the group of etchant gases consisting of HBr, HI, $Br_2$, $Cl_2$, HCl, or combinations thereof.

In one embodiment of this aspect, the gas may establish a gas number density, n, sufficient to operate over the distance, d, to reduce ion energy below 30 eV before the ions reach the optic.

In one arrangement of this aspect, the system may comprise a droplet generator providing droplets, the droplets comprising tin, and a laser illuminating droplets to create the plasma, the laser comprising a gain medium comprising $CO_2$.

DETAILED DESCRIPTION

Figure 1:
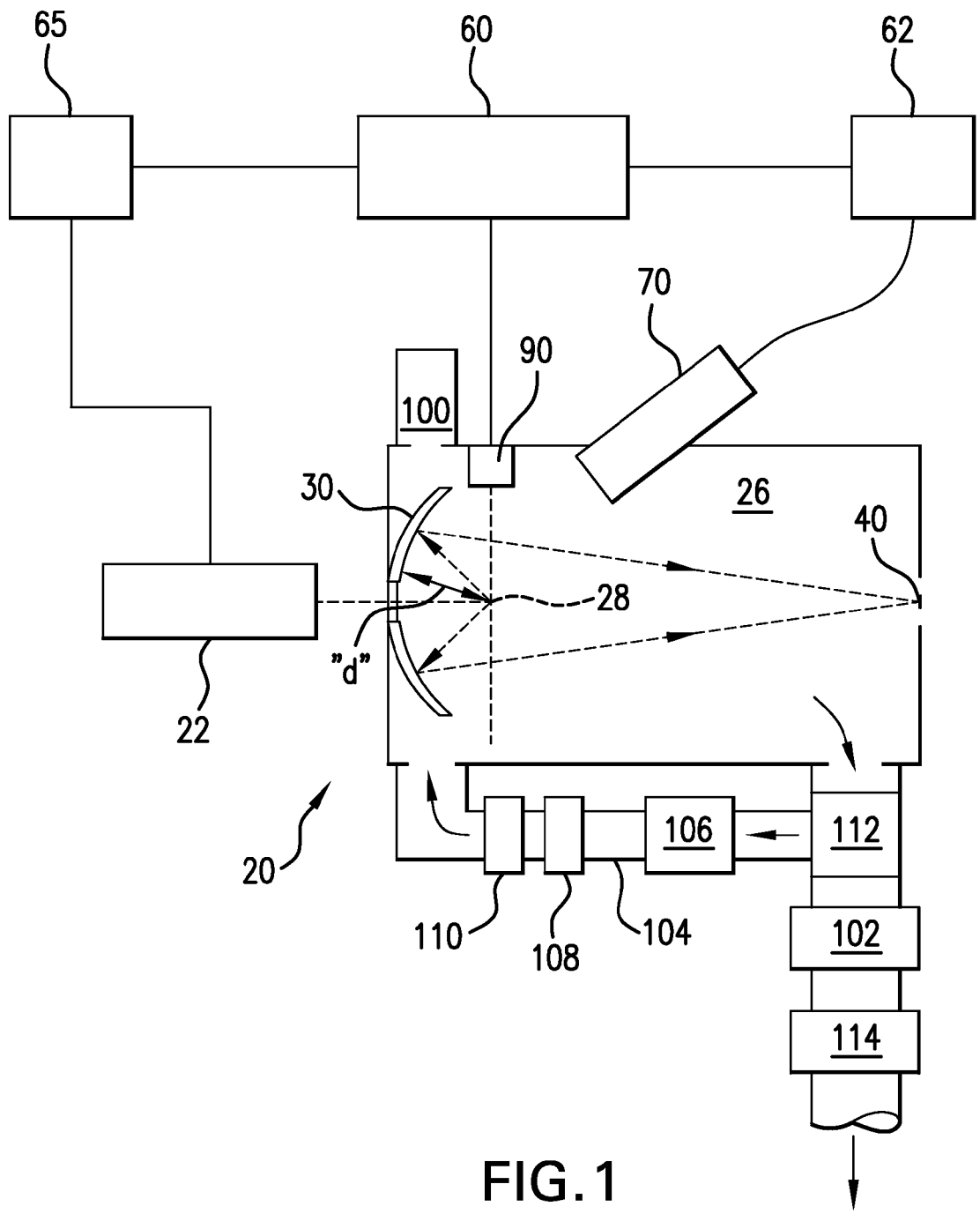
FIG. 1 shows a simplified, schematic view of a laser produced plasma EUV light source.

With initial reference to FIG. 1 there is shown a schematic view of an EUV light source, such as a laser produced plasma EUV light source 20 according to one aspect of an embodiment. As shown in FIG. 1, and described in further detail below, the LPP light source 20 may include a system 22 for generating a train of light pulses and delivering the light pulses into a chamber 26. For the source 20, the light pulses may travel along one or more beam paths from the system 22 and into the chamber 26 to illuminate one or more targets at an irradiation region 28.

Suitable lasers for use in the device 22 shown in FIG. 1 may include a pulsed laser device, e.g., a pulsed gas discharge $CO_2$ laser device producing radiation at 9.3 μm, 9.6 μm or 10.6 μm, e.g., with DC or RF excitation, operating at relatively high power, e.g., 10 kW or higher and high pulse repetition rate, e.g., 50 kHz or more. In one particular implementation, the laser may have a MOPA configuration with multiple stages of axial-flow RF-pumped $CO_2$ amplification and having a seed pulse that is initiated by a Q-switched Master Oscillator (MO) with low energy and high repetition rate, e.g., capable of 50 kHz operation. From the MO, the laser pulse may then be amplified, shaped, and/or focused before entering the LPP chamber. Continuously pumped $CO_2$ amplifiers may be used for the system 22. For example, a suitable $CO_2$ laser device having an oscillator and three amplifiers (O-PA1-PA2-PA3 configuration) is disclosed in co-pending U.S. application Ser. No. 11/174,299 filed on Jun. 29, 2005, and entitled, LPP EUV LIGHT SOURCE DRIVE LASER SYSTEM, the entire contents of which are hereby incorporated by reference herein.

Depending on the specific application, other types of lasers may also be suitable, e.g., an excimer or molecular fluorine laser operating at high power and high pulse repetition rate. Examples include, a solid state laser, e.g., having a fiber or disk shaped active media, a MOPA configured excimer laser system, e.g., as shown in U.S. Pat. Nos. 6,625,191, 6,549,551, and 6,567,450, an excimer laser having one or more chambers, e.g., an oscillator chamber and one or more amplifying chambers (with the amplifying chambers in parallel or in series), a master oscillator/power oscillator (MOPO) arrangement, a power oscillator/power amplifier (POPA) arrangement, or a solid state laser that seeds one or more excimer or molecular fluorine amplifier or oscillator chambers, may be suitable. Other designs are possible.

As further shown in FIG. 1, the EUV light source 20 may also include a target material delivery system 90, e.g., delivering droplets of a target material into the interior of a chamber 26 to the irradiation region 28 where the droplets will interact with one or more light pulses, e.g., zero, one or more pre-pulses and thereafter one or more main pulses, to ultimately produce a plasma and generate an EUV emission. The target material may include, but is not necessarily limited to, a material that includes tin, lithium, xenon or combinations thereof. The EUV emitting element, e.g., tin, lithium, xenon, etc., may be in the form of liquid droplets and/or solid particles contained within liquid droplets or any other form which delivers the EUV emitting element to the irradiation region 28 in discrete, semi-continuous and/or continuous amounts. For example, the element tin may be used as pure tin, as a tin compound, e.g., SnBr$_4$, SnBr$_2$, SnH$_4$, as a tin alloy, e.g., tin-gallium alloys, tin-indium alloys, tin-indium-gallium alloys, or a combination thereof. Depending on the material used, the target material may be presented to the irradiation region 28 at various temperatures including room temperature or near room temperature (e.g., tin alloys, SnBr$_4$) at an elevated temperature, (e.g., pure tin) or at temperatures below room temperature, (e.g., SnH$_4$), and in some cases, can be relatively volatile, e.g., SnBr$_4$. More details concerning the use of these materials in an LPP EUV source is provided in co-pending U.S. application Ser. No. 11/406,216 filed on Apr. 17, 2006 entitled ALTERNATIVE FUELS FOR EUV LIGHT SOURCE, the contents of which are hereby incorporated by reference herein.

Continuing with FIG. 1, the EUV light source 20 may also include an optic 30, e.g., a collector mirror in the form of a truncated ellipsoid having, e.g., a graded multi-layer coating with alternating layers of Molybdenum and Silicon on a substrate, e.g. SiC, polycrystalline Si, single crystal Si, etc. FIG. 1 shows that the optic 30 may be formed with a through-hole to allow the light pulses generated by the system 22 to pass through the optic 30 to reach the irradiation region 28. As shown, the optic 30 may be, e.g., an ellipsoidal mirror that has a first focus within or near the irradiation region 28 and a second focus at a so-called intermediate region 40 where the EUV light may be output from the EUV light source 20 and input to a device utilizing EUV light, e.g., an integrated circuit lithography tool (not shown in FIG. 1). Also shown, the optic 30 may be positioned such that the closest operable point on the optic 30 is located at a distance, d from the irradiation region 28. It is to be appreciated that other optics may be used in place of the ellipsoidal mirror for collecting and directing light to an intermediate location for subsequent delivery to a device utilizing EUV light, for example the optic may be parabolic or may be configured to deliver a beam having a ring-shaped cross-section to an intermediate location, see e.g. co-pending U.S. application Ser. No. 11/505,177 filed on Aug. 16, 2006, entitled EUV OPTICS, the contents of which are hereby incorporated by reference.

For the device 20, a temperature control system may be used to maintain the optic 20 within a pre-selected operational temperature range. The temperature control system may include heating, e.g. one or more ohmic heaters placed on the collector mirror substrate backside, and/or cooling, e.g. one or more cooling channels formed in the collector mirror substrate to pass a heat exchange fluid, e.g. water or liquid gallium.

As used herein, the term "optic" and its derivatives includes, but is not necessarily limited to, components which reflect and/or transmit and/or operate on incident light and includes, but is not limited to, lenses, windows, filters, wedges, prisms, grisms, gradings, etalons, diffusers, transmission fibers, detectors and other instrument components, apertures, stops and mirrors including multi-layer mirrors, near-normal incidence mirrors, grazing incidence mirrors, specular reflectors and diffuse reflectors. Moreover, as used herein, the term "optic" and its derivatives is not meant to be limited to components which operate solely or to advantage within one or more specific wavelength range(s) such as at the EUV output light wavelength, the irradiation laser wavelength, a wavelength suitable for metrology or any other particular wavelength or wavelength band.

Continuing with reference to FIG. 1, the EUV light source 20 may also include an EUV controller 60, which may also include a drive laser control system 65 for triggering one or more lamps and/or laser devices in the system 22 to thereby generate light pulses for delivery into the chamber 26, and/or for controlling beam delivery, e.g. optics moveable via actuator to adjust beam focusing, beam steering, beam shape, etc. A suitable beam delivery system for pulse shaping, focusing, steering and/or adjusting the focal power of the pulses is disclosed in co-pending U.S. application Ser. No. 11/358,992 filed on Feb. 21, 2006, entitled LASER PRODUCED PLASMA EUV LIGHT SOURCE, the contents of which are hereby incorporated by reference herein. As disclosed therein, one or more beam delivery system optics may be in fluid communication with the chamber 26. Pulse shaping may include adjusting pulse duration, using, for example a pulse stretcher and/or pulse trimming.

The EUV light source 20 may also include a droplet position detection system which may include one or more droplet imagers 70 that provide an output indicative of the position of one or more droplets, e.g., relative to the irradiation region 28. The imager(s) 70 may provide this output to a droplet position detection feedback system 62, which can, e.g., compute a droplet position and trajectory, from which a droplet error can be computed, e.g., on a droplet by droplet basis or on average. The droplet error may then be provided as an input to the controller 60, which can, for example, provide a position, direction and/or timing correction signal to the system 22 to control a source timing circuit and/or to control a beam position and shaping system, e.g., to change the location and/or focal power of the light pulses being delivered to the irradiation region 28 in the chamber 26. Also for the EUV light source 20, the target material delivery system 90 may have a control system operable in response to a signal (which in some implementations may include the droplet error described above, or some quantity derived therefrom) from the controller 60, to e.g., modify the release point, release timing and/or droplet modulation to correct for errors in the droplets arriving at the desired irradiation region 28.

For the EUV light source 20, the droplet delivery mechanism may include, for example, a droplet dispenser creating either 1) one or more streams of droplets exiting the dispenser or 2) one or more continuous streams which exit the dispenser and subsequently break into droplets due to surface tension. In either case, droplets may be generated and delivered to the irradiation region 28 such that one or more droplets may simultaneously reside in the irradiation region 28 allowing one or more droplets to be simultaneously irradiated by an initial pulse, e.g., pre-pulse to form an expanded target suitable for exposure to one or more subsequent laser pulse(s), e.g., main pulse(s), to generate an EUV emission. In one embodiment, a multi-orifice dispenser may be used to create a "showerhead-type" effect. In general, for the EUV light source 20, the droplet dispenser may be modulating or non-modulating and may include one or several orifice(s) through which target material is passed to create one or more droplet streams. More details regarding the dispensers described above and their relative advantages may be found in co-pending U.S. application Ser. No. 11/358,988 filed on Feb. 21, 2006, entitled LASER PRODUCED PLASMA EUV LIGHT SOURCE WITH PRE-PULSE, co-pending U.S. application Ser. No. 11/067,124 filed on Feb. 25, 2005, entitled METHOD AND APPARATUS FOR EUV PLASMA SOURCE TARGET DELIVERY, and co-pending U.S. application Ser. No. 11/174,443 filed on Jun. 29, 2005, entitled LPP EUV PLASMA SOURCE MATERIAL TARGET DELIVERY SYSTEM, co-pending U.S. application Ser. No. 11/827,803 filed on Jul. 13, 2007, entitled LASER PRODUCED PLASMA EUV LIGHT SOURCE HAVING A DROPLET STREAM PRODUCED USING A MODULATED DISTURBANCE WAVE, the contents of each of which are hereby incorporated by reference herein.

The EUV light source 20 may include one or more EUV metrology instruments (not shown) for measuring various properties of the EUV light generated by the source 20. These properties may include, for example, intensity (e.g., total intensity or intensity within a particular spectral band), spectral bandwidth, polarization, etc. For the EUV light source 20, the instrument(s) may be configured to operate while the downstream tool, e.g., photolithography scanner, is on-line, e.g., by sampling a portion of the EUV output, e.g., using a pickoff mirror or sampling "uncollected" EUV light, and/or may operate while the downstream tool, e.g., photolithography scanner, is off-line, for example, by measuring the entire EUV output of the EUV light source 20.

As indicated above, irradiation of a target at the irradiation region 28 produces a plasma and generates an EUV emission. In addition, as a by-product of this process, ions may be generated which exit the plasma, typically, in all directions. Generally, the ion's initial energy exiting the plasma will vary over a range, with the range being affected by a number of factors including, but not limited to, the wavelength, energy, intensity and pulse-shape of the irradiating light, and the composition, size, shape and form of the target material. Also indicated above, these ions may, if unabated, degrade nearby optics, such as mirrors, laser input windows, metrology windows, filters, etc.

FIG. 1 shows that a flowing gas may be disposed between the plasma (irradiation region 28) and optic, the gas establishing a gas number density, n, (i.e. number of molecules/volume) sufficient to operate over the distance, d, to reduce ion energy to a target maximum energy level before the ions reach the optic. For example, a gas number density sufficient to reduce ion energy to a target maximum energy level between about 10-200 eV, and in some cases below 30 eV may be provided. For operation of the device shown in FIG. 1, it is contemplated that the flowing gas establishing a target gas number density over the distance, d, will be present, and flowing, during EUV light generation. Factors which may be considered in selecting a suitable gas composition and gas number density include the ion stopping power of the gas composition (e.g. slowing ions below about 30 eV over a distance of about 10-30 cm) and the EUV absorption of the gas as a function of number density (e.g. providing an acceptable in-band EUV absorption over a distance of about 1-2 m as the EUV light travels from the plasma to the collector mirror and then on to the intermediate region 40.

Suitable gases may, depending on the specific application, include hydrogen e.g., greater than 50 percent hydrogen (protium and/or deuterium isotopes), helium and combinations thereof. For example, for a plasma generating ions having a maximum initial ion energy and distance, d, of about 15 cm from the plasma, a suitable gas for reducing ion energy below about 30 eV may be hydrogen gas at a pressure of about 500 mtorr at room temperature may be suitable. For some arrangements, pressures in the range of about 500 mtorr to 2000 mtorr may be employed. SRIM (Stopping and Range of Ions in Matter) software (available at www-srim-org website) can be used to determine the gas number density (operable over a given distance, d) that is required to reduce the energy of an ion (having an initial ion energy) to below a selected energy. From the number density, the expected EUV absorption by the gas can be calculated. It is to be further appreciated that gas introduced into the chamber may react with chamber conditions, ions and/or the plasma to dissociate and/or create ions, e.g. atomic hydrogen and/or hydrogen ions which may be effective for cleaning/etching and/or ion slowing.

FIG. 1 further shows that the light source 20 may include a gas management system including a regulated gas source 100 for introducing one or more gas(ses) into the chamber 26, an adjustable pump 102 for removing gas from the chamber 26, and an external guideway 104 for establishing a closed loop flow path. FIG. 1 also shows that the light source 20 may include a pump 106 forcing gas through the closed loop flow path, a heat exchanger 108 removing heat from gas flowing in the flow path, and a filter 110 removing at least a portion of a target species, e.g. contaminants, from gas flowing in the flow path. These contaminants may degrade optical components and/or absorb EUV light. A valve 112, regulator(s), or similar device may be provided to meter the amount of gas which is directed to pump 102 or 106. As shown, a conditioner 114 may be provided to dilute and/or scrub the gas prior to release. With this arrangement, a flowing gas may be disposed between the optic 30 and irradiation region 28. Removal of gas from the chamber 26 via pump 102 may be performed to maintain a constant gas pressure in the chamber 26 in response to gas additions from the gas source 100, and/or to remove contaminants, vapor, metal dust, etc. from the chamber 26, and/or to establish a pressure gradient in the chamber 26, e.g. to maintain a relatively large pressure between the optic 28 and irradiation region 28 and a smaller, relatively low pressure between the irradiation region 28 and the intermediate region 40. In addition, pump 106, heat exchanger 108 and filter 110 may cooperate to remove heat and thereby control the temperature within the chamber 26, to control the temperature of the optic 30 and/or to remove contaminants, vapor, metal dust, etc. from the chamber 26 and/or to provide a pressure gradient in the chamber 26, e.g. to maintain a relatively large pressure between the optic 28 and irradiation region 28 and a smaller, relatively low pressure between the irradiation region 28 and the intermediate region 40.

Control of the gas source 100 and pumps 102, 106 may be used, concertedly, to maintain a selected gas pressure/pressure gradient and/or to maintain a selected flow rate through the chamber 26 and/or to maintain a selected gas composition, e.g. a selected ratio of several gases, e.g. $H_2$, HBr, He, etc. Typically, the selected flow rate may depend, among other things, on the light source power input to the chamber, the amount of gas mixing, the efficient of the heat exchanger 108 and the efficiency of other component cooling systems, e.g. the collector mirror cooling system.

By way of example, for a Sn target and $CO_2$ laser system with the optic 30 positioned about 15 cm from the irradiation site 28, a laser pulse energy of about 500 mJ and an EUV output repetition rate in the range of 10-100 kHz, a flow rate of about 200-400 slm (standard liters per minute) or greater, may be employed.

For the light source 20, the gas source 100 may introduce several gases, for example $H_2$, He, Ar and HBr, either separately and independently, or the gas may be introduced as a mixture. Moreover, although FIG. 1 illustrates the gas being introduced at one location, it is to be appreciated that the gas may be introduced at multiple locations, may be removed at multiple locations and/or may be evacuated for circulation at multiple locations. The gas may be supplied via a tank or may be generated locally. For example, the gas source 100 may include an on-demand hydrogen/deuterium generator. Several types are available including a device with extracts hydrogen/deuterium from water/heavy water using a proton exchange membrane. Such a device is marketed and sold by Domnick Hunter under the product name Hydrogen Generator, for example see the www-domnickhunter-com website for details.

Depending on the gas used, conditioner 114 may provide an appropriate chemical scrubber, e.g. to scrub etchant gas vapors, and/or a source of a diluent gas to dilute the exiting gas prior to release into the atmosphere. For example, when $H_2$ is used (which tends to be explosive at number densities of 4-25%), a diluent gas such as $N_2$, of air may be used to reduce the $H_2$ concentration before release (generally below 4% and more preferably below 0.4%). Alternatively, or in addition to the use of a diluent gas, a catalytic converter, possibly having a Platinum catalyst may be used to convert hydrogen to water.

Suitable gases for reducing ion energy may include, but are not limited to, hydrogen (protium and deuterium isotopes), helium and combinations thereof. In addition, a cleaning/etching gas for removing contaminants that have deposited on surfaces of optics may be included such as a gas having a halogen. For example, the etchant gas may include HBr, HI, $Br_2$, $Cl_2$, HCl, or combinations thereof. By way of example, a suitable composition when Sn or a Sn compound is used as the target material may include 50-99% $H_2$ and 1-50% HBr.

Figure 2A:
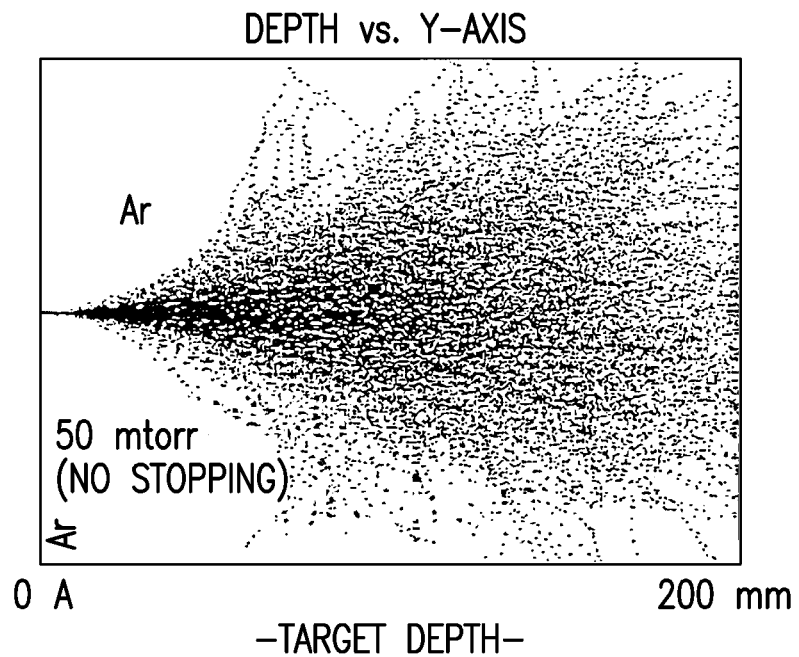
FIG. 2A shows a calculated plot using SRIM software illustrating that ions are significantly scattered but are not stopped in Argon gas at 50 mTorr over a distance, d, of 200 mm.
Figure 2B:
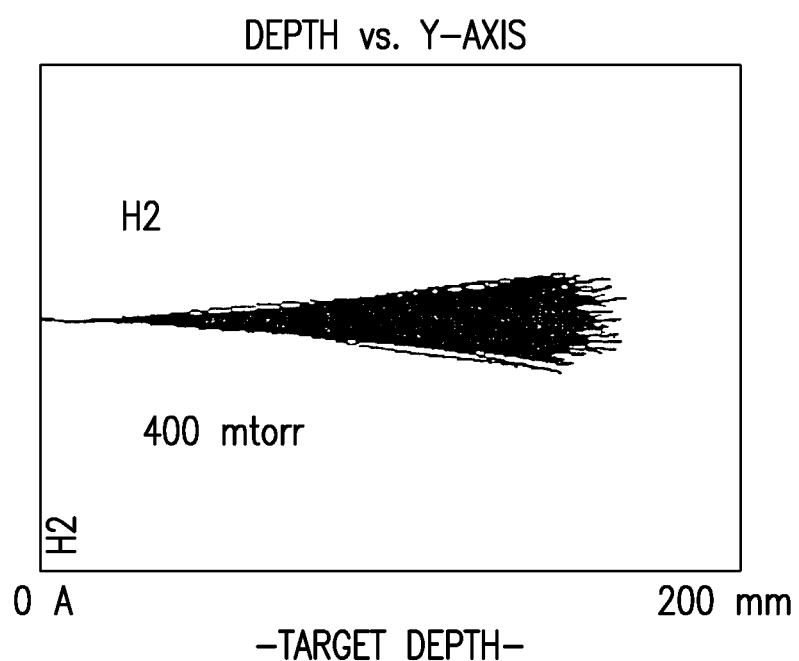
FIG. 2B shows a calculated plot using SRIM software illustrating that ions have less scattering (compared to FIG. 2A) and may be effectively stopped in Hydrogen gas at 400 mTorr at a distance, d, of about 170 mm.

FIG. 2A shows a calculated plot using SRIM software illustrating that ions having an initial energy of 10 keV are significantly scattered but are not stopped in Argon gas at 50 mTorr over a distance, d, of 200 mm. On the other hand, FIG. 2B shows a calculated plot using SRIM software illustrating that ions having an initial energy of 10 keV have less scattering (compared to FIG. 2A) and may be effectively stopped in Hydrogen gas at 400 mTorr at a distance, d, of about 170 mm.

Figure 3:
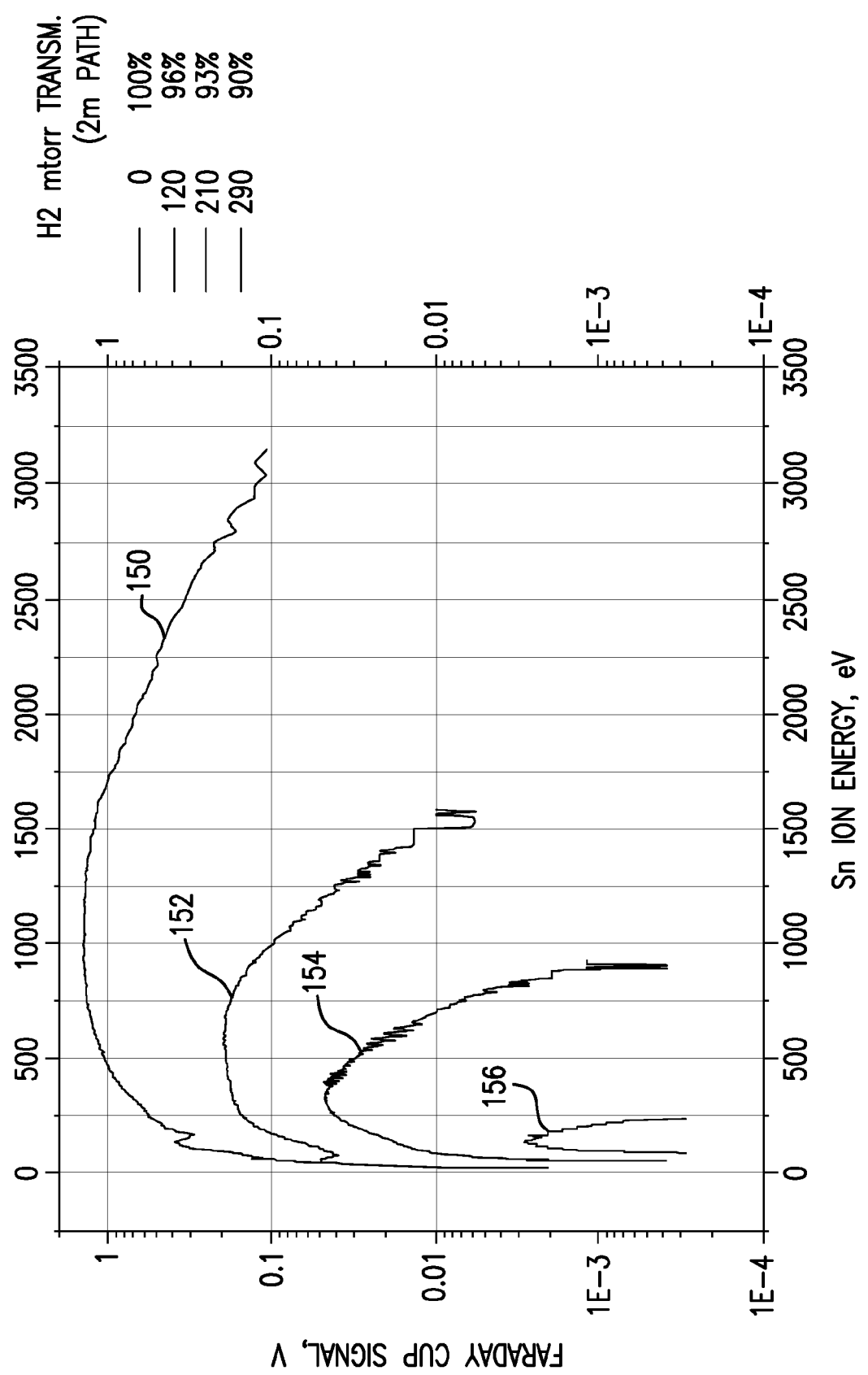
FIG. 3 shows measured plots illustrating ion stopping at three different hydrogen pressures at a distance of 16.5 cm from the plasma.

FIG. 3 shows measured plots illustrating ion stopping at three different hydrogen pressures. As shown, in the absence of any stopping gas, e.g. hydrogen, the distribution of ion energies is represented by curve 150 which shows that the maximum initial ion energy is about 3 keV. These ions where generated by irradiating a flat Sn target with $CO_2$ laser pulse at optimal intensity for in-band conversion (e.g. CE~4.5%). Measurements were conducted using a Faraday Cup (Model FC-73A from Kimball Physics) positioned about 16.5 cm from the irradiation zone and positioned to receive ions at an angle of about 45 degrees from the input laser beam axis. Curve 152 shows that for ions having an initial maximum ion energy of about 3 keV, maximum ion energy is reduced to about 1.5 keV over a distance, d, of 16.5 cm in uniform, non-flowing Hydrogen gas at 120 mTorr. Curve 154 shows that for ions having an initial maximum ion energy of about 3 keV, maximum ion energy is reduced to about 0.9 keV over a distance, d, of 16.5 cm in uniform, non-flowing Hydrogen gas at 210 mTorr. Curve 156 shows that for ions having an initial maximum ion energy of about 3 keV, maximum ion energy is reduced to about 0.25 keV over a distance, d, of 16.5 cm in uniform, non-flowing Hydrogen gas at 290 mTorr. FIG. 3 also shows calculated EUV transmissions over a 2 m path for the three hydrogen pressures, with Hydrogen gas at 120 mTorr having 96% transmission, Hydrogen gas at 210 mTorr having 93% transmission, and Hydrogen gas at 290 mTorr having 90% transmission.

Figure 4A:
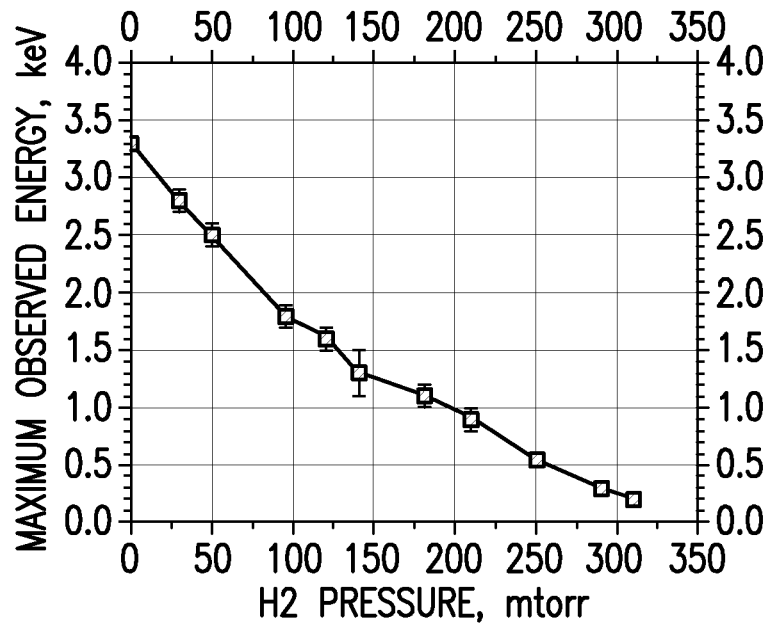
FIG. 4A shows a plot of maximum observed energy at a distance of 16.5 cm from the plasma versus hydrogen pressure for ions having initial ion energies as shown in curve 150 of FIG. 3.
Figure 4B:
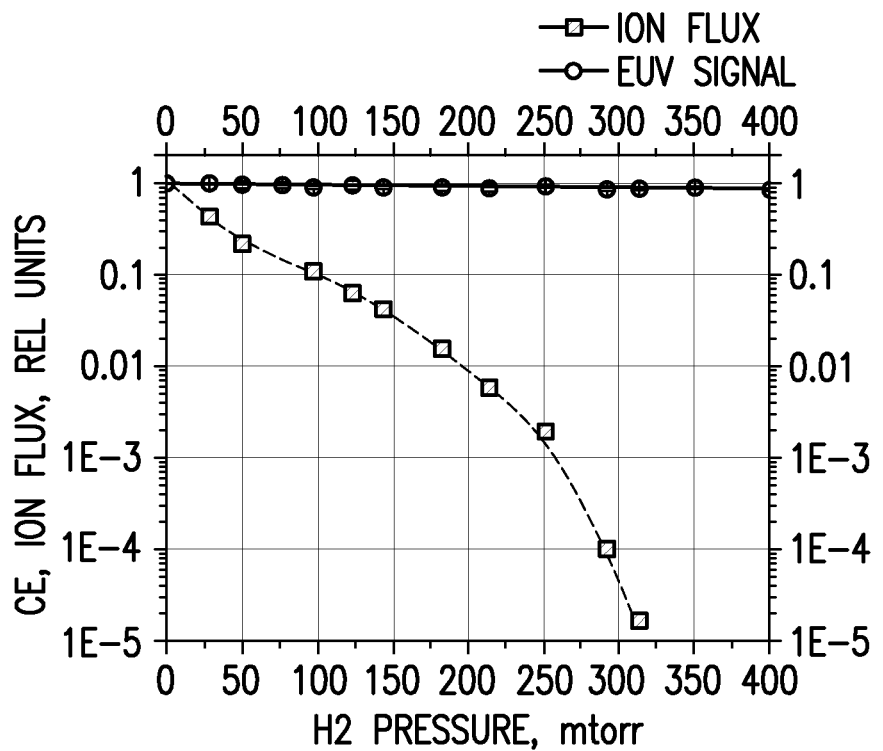
FIG. 4B shows in-band EUV signal after passing through a distance d, of 145 cm as a function of Hydrogen pressure; and ion flux as a function of Hydrogen pressure with ion flux calculated as $\int I(E)dE$ at a distance of 16.5 cm from the plasma.
Figure 4C:
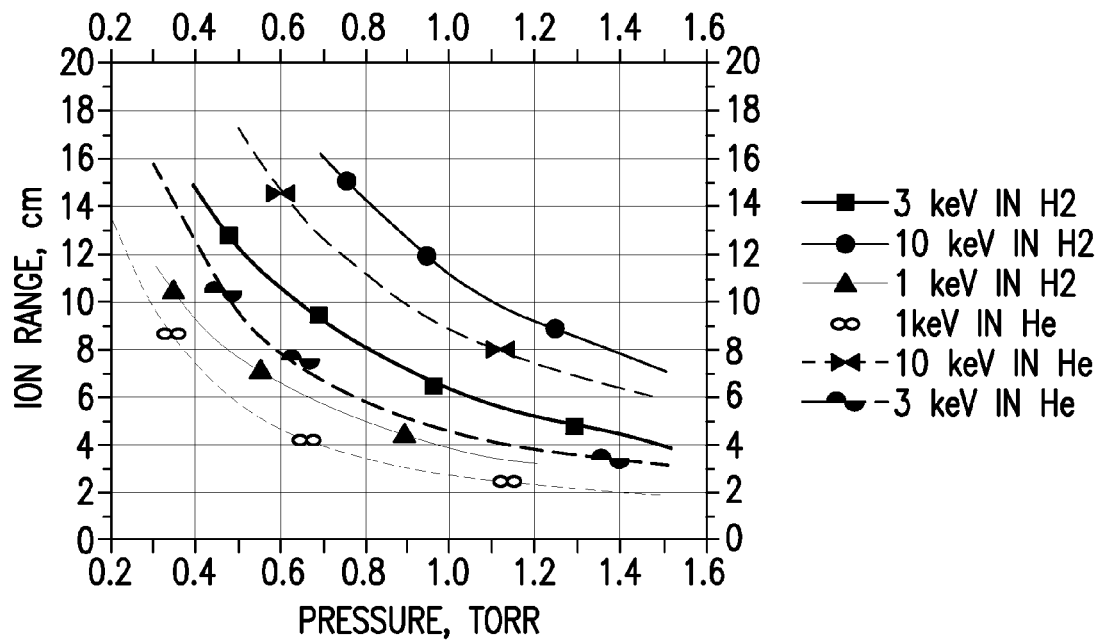
FIG. 4C shows plots of ion range (in cm) as function of gas pressure (for Hydrogen and Helium gases) for various initial ion energies as calculated using SRIM simulation software.

FIG. 4A shows a plot of maximum observed energy versus hydrogen pressure for ions having initial ion energies as shown in curve 150 of FIG. 3 using a Faraday Cup positioned 16.5 cm from the irradiation zone and at an angle of about 45 degrees from the input laser beam axis. FIG. 4B shows a measured normalized in-band EUV signal after passing through a distance of 145 cm as a function of Hydrogen pressure; and ion flux as a function of Hydrogen pressure with ion flux calculated as $\int I(E)dE$. FIG. 4C shows a plot of ion range (in cm) as function of gas pressure for various initial ion energies and for Hydrogen and Helium gases as calculated using SRIM simulation software (as described above).

The above data demonstrate an ion mitigation technique which may be used to suppress ion flux (i.e., the energy-integrated signal) by at least 4 orders of magnitude with an acceptable level of EUV absorption. In some cases, the collector mirror reflective coating may have about 500 sacrificial layers and still provide full EUV reflectivity. Taking into account a measured erosion rate of 0.2 layers per Million pulses (in the absence of ion mitigation) and the suppression factor of $10^4$ (due to the above-described mitigation), a collector lifetime exceeding $10^{12}$ pulses is estimated corresponding to about 1 year of operation of the collector mirror in a high volume manufacturing environment.

The use of an ion stopping gas and/or etchant gas(es) as described above, may, depending on the specific application, be used alone or in combination with one or more other ion mitigation techniques such as the use of a foil shield (with or without a slowing or deflecting gas), and the use of an electric and/or magnetic field(s) to deflect or slow ions and/or the use of pulse shaping to reduce ion flux, see e.g. co-pending U.S. application Ser. No. 11/786,145 filed on Apr. 10, 2007, entitled LASER PRODUCED PLASMA EUV LIGHT SOURCE, the contents of which are hereby incorporated by reference.

Figure 5:
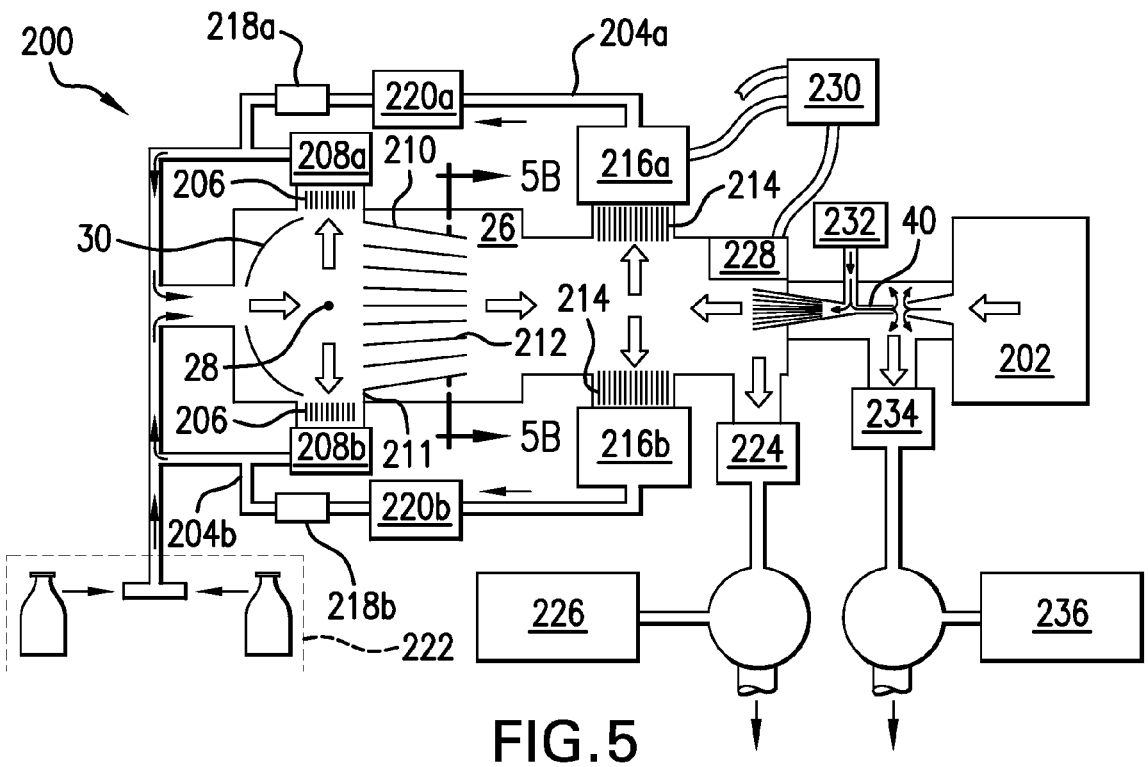
FIG. 5 shows a sectional view through a simplified, EUV light source illustrating an embodiment of an EUV light source gas management system.

FIG. 5 shows the gas management components of a light source 200 having a chamber 26 in which an optic 30 formed with a through-hole is disposed, e.g. a near-normal incidence, ellipsoidal collector mirror for directing EUV light from an irradiation region 28, e.g. where a target material droplet is irradiated by a drive laser (not shown) producing EUV radiation, to an intermediate region 40 for subsequent use by a scanner 202.

Figure 5A:
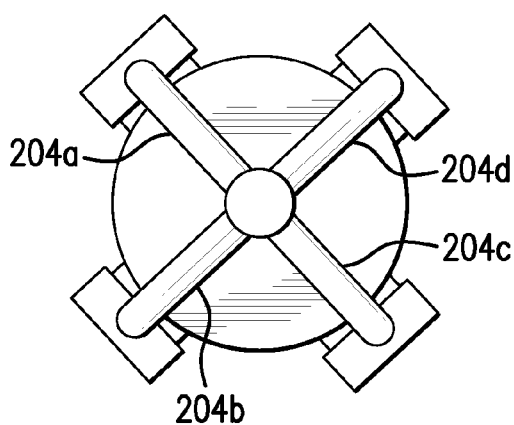
FIG. 5A shows a side view of the EUV light source shown in FIG. 5.

As shown in FIG. 5, the gas management system may include an enclosing structure defining one or more closed loop flow paths, the enclosing structure having a vessel, e.g. chamber 26, in fluid communication with one or more guideways 204a,b, each guideway 204a,b being external to the chamber 26. Although FIGS. 5 and 5A illustrate a gas management system having four external guideways 204a-d, it is to be appreciated that more than four and as few as one external guideway may be used.

Continuing with FIG. 5, it can be seen that within each closed loop flow path, gas is directed through the through-hole formed in the optic 30 and toward the irradiation region 28. From the through-hole, a portion of the gas flows through heat exchanger 206 and into pumps 208a,b. For the optic 30 shown in FIG. 5, the through-hole also functions to pass a laser beam from a laser source (not shown) to the irradiation region 28, although, as discussed below, other through-holes may be used to flow gas through the optic 30.

For the source 200 shown, heat exchanger 206 may consist of a plurality of spaced apart, parallel, annularly shaped metal plates, with each plate extending around the circumference of the chamber 26. One, some or all of the plates may be formed with one or more internal passages to pass a heat exchange fluid, e.g. water, to cool each plate. The heat exchanger 206 may function to cool gas flowing through the exchanger 206 and/or to condense target material vapors that may undesirably absorb EUV radiation and/or foul optics, e.g. tin vapor when tin is used as a target material. Once cooled, the gas may pass through pumps 208a,b, which may be, for example, a turbo-pump or a roots-type booster, and thereafter be directed through an external guideway to a location where the gas will, once again flow through the through-hole formed in the optic 30. It is to be appreciated that one or more flow regulators (not shown) may be provided, e.g. one regulator near each pump, to balance flow throughout the gas management system.

Figure 5B:
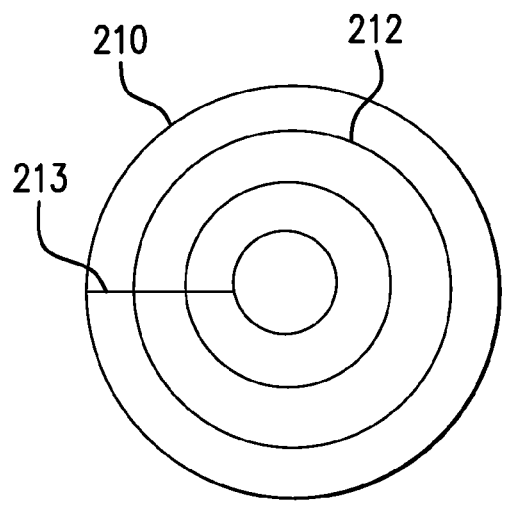
FIG. 5B shows a sectional view through the multi-channel structure shown in FIG. 5 as seen along line 5B-5B in FIG. 5 showing a multi-channel structure having concentric, conical vanes.
Figure 5C:
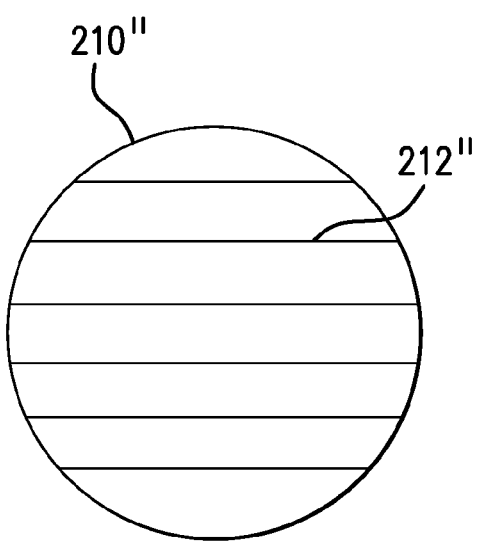
FIG. 5C shows a sectional view through the multi-channel structure shown in FIG. 5 as seen along line 5B-5B in FIG. 5 showing a multi-channel structure having converging, flat plate vanes.

FIGS. 5 and 5B also show that a portion of the gas from the through-hole may flow within chamber 26 through multi-channel structure 210. As seen there, the multi-channel structure 210 may be disposed between the irradiation location 28 and the intermediate point 40 and may include a plurality of concentric, conical shaped vanes 212 that are arranged to allow light to travel from the optic 30 to the intermediate region 40 and may be designed to minimize EUV light obscuration. In addition, vane location may be selected to correspond to light paths which are unusable by the scanner 202, due, e.g. to obstructions in the scanner. One or more radial members 213 may be provided to support the concentric, conical shaped vanes. FIG. 5C shows another embodiment in which the vanes 212" consist of flat plates converging toward the intermediate region 40, as shown. A flange 211 may be provided to restrict flow between the wall of the chamber 26 and the multi-channel structure 210, as shown.

Figure 6:
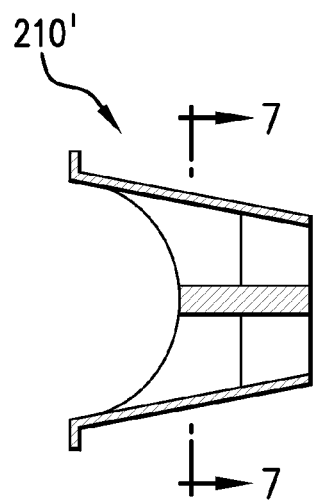
FIG. 6 shows an alternative embodiment of a multi-channel structure having radial vanes.
Figure 7:
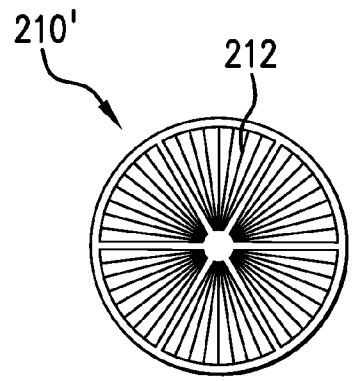
FIG. 7 shows a section view of the multi-channel structure of FIG. 6 as seen along line 7-7 in FIG. 6.

FIGS. 6 and 7 show an alternative arrangement for a multi-channel structure 210' which includes a plurality of radially oriented vanes 212'. Alternatively, a multi-channel structure having both concentric conical and radial vanes may be employed. For the multi-channel structures, 210, 210', 210" shown in FIGS. 5-7, one, some or all of the vanes may be formed with internal passages to flow a heat exchange fluid, e.g. water or liquid gallium, to cool each vane. The multi-channel structures, 210, 210', 210" may function to cool gas flowing through the multi-channel structures, 210, 210', 210" and/or to condense target material vapors that may undesirably absorb EUV radiation, e.g. tin vapor when tin is used as a target material and/or to provide significant resistance to gas flow, thus, establishing a pressure gradient in the chamber 26 with a relatively high gas pressure upstream of the multi-channel structures, 210, 210', 210", e.g. between the irradiation region 28 and optic 30 to e.g. provide ion stopping and/or etching power, and a relatively low gas pressure downstream of the multi-channel structures, 210, 210', 210", e.g. between the multi-channel structures, 210, 210', 210" and the intermediate region 40, to e.g. minimize EUV absorption.

For the device shown, the multi-channel structures, 210, 210', 210" may be positioned to receive source material from irradiation zone 28. As disclosed herein, depending on the specific application, the structure 210, 210', 210" may be used alone or in combination with one or more other debris mitigation techniques such as the use of an ion slowing gas as described above, the use of a foil shield (with or without an ion slowing or deflecting gas), the use of an electric and/or magnetic field(s) to deflect or slow ions, and the use of a pulse-shaped beam.

A beam stop may be provided which may be separate from, attached to or formed integral with the multi-channel structure 210, 210', 210". In the operation of the device, a target material, such as a droplet, is irradiated by one or more pulses to generate plasma. Typically, irradiated target material moves along the beam direction and spreads into a wide solid angle. A large portion of the material may be collected by the multi-channel structure 210, 210', 210", which also may be temperature controlled. For example, a temperature controlled beam stop for collecting and directing LPP target material is disclosed and claimed in co-pending U.S. application Ser. No. 11/509,925 filed on Aug. 25, 2006, entitled SOURCE MATERIAL COLLECTION UNIT FOR A LASER PRODUCED PLASMA EUV LIGHT SOURCE, the entire contents of which are hereby incorporated by reference herein. See also co-pending U.S. application Ser. No. 11/786,145 filed on Apr. 10, 2007, entitled LASER PRODUCED PLASMA EUV LIGHT SOURCE, the entire contents of which are hereby incorporated by reference herein.

By-products of the target material irradiation may include metal dust, target material vapor and micro-droplets or clusters and can be in several forms, for example, when tin, e.g., pure tin, or a tin compound, e.g., $SnBr_4$, $SnH_4$, $SnBr_2$ etc, is used as the source material, the by-products may include tin and tin compounds including oxides. Dusts and other contaminates, e.g., from collector mirror erosion, etc. may also be present in the chamber. These by-products may, among other things, damage optics and absorb/scatter EUV radiation.

By way of example, and not limitation, the multi-channel structure 210, 210', 210" may function to collected liquids and solids (in some cases remelting solids) and/or condensing vapors. For a target material containing Sn, some or all of the operable surfaces of the multi-channel structure 210, 210', 210" may be maintained at a temperature above the melting point of Sn, e.g., above about 230° C. At this temperature, micro-droplets may stick to the surface of the multi-channel structure 210, 210', 210", and in some cases, flow downwardly by gravitational force. Solidified metal dust may be re-melted into the molten material and also flow downward. The compounds of Sn (e.g., oxides) may also be trapped by the liquid flow and removed from the chamber. The multi-channel structure 210, 210', 210" may have inter-connecting channels (not shown) for directing liquid metal flow from surfaces to the bottom where the liquid metal may be collected. The location and direction of the channels may be configured relative to the EUV source orientation (e.g. the light source axis may be tilted relative to horizontal at about 28 degrees) to ensure proper flow of liquid on the multi-channel structure 210, 210', 210". On the other hand, in some applications, some or all of the operable surfaces of the multi-channel structure 210, 210', 210" may be maintained at a temperature below the melting point of Sn, e.g., below about 230° C. (for a target material containing Sn). At these temperatures, condensation is promoted and liquids and solids may be allowed to accumulate on the multi-channel structure 210, 210', 210". The multi-channel structure 210, 210', 210" may also function as a cold trap condensing vapors, e.g., Sn vapor present in the chamber.

FIG. 5 shows that from the multi-channel structures, 210, gas flows generally in the direction of the intermediate region 40. FIG. 5 also shows that some, a portion, or all of the gas exiting the multi-channel structures, 210 may pass through heat exchanger 214 and into pumps 216a,b. For the source 200 shown, heat exchanger 214 may consist of a plurality of spaced apart, parallel, annularly shaped metal plates that extend around the circumference of the chamber 26. One, some or all of the plates may be formed with one or more internal passages to pass a heat exchange fluid, e.g. water, to cool each plate. The heat exchanger 214 may function to cool gas flowing through the exchanger 214 and/or to condense target material vapors that may undesirably absorb EUV radiation, e.g. tin vapor when tin is used as a target material. Once cooled, the gas may pass through pumps 216a,b, which may be, for example, a turbo-pump or a roots-type booster, and thereafter be directed through an external guideway 204a,b to a location where the gas will, once again flow through the through-hole formed in the optic 30. It is to be appreciated that one or more flow regulators (not shown) may be provided, e.g. one regulator near each pump, to balance flow throughout the gas management system. One or both of the guideways 204a,b may include an optional filter 218a,b and/or an additional, optional, heat exchanger 220a,b. For the light source 200, the filters 218a,b may function to removing at least a portion of a target species, e.g. contaminants that may degrade optical components and/or absorb EUV light, from gas flowing in the flow path. For example, when a tin containing material is used as a source material to generate the plasma, contaminants such as tin hydrides, tin oxides and tin bromides may be present in the gas which may degrade optical components and/or absorb EUV light. These contaminants may be removed using one or more suitable filters, e.g. zeolite filters, cold traps, chemical absorbers, etc. The heat exchangers 220a,b may, for example, consist of a plurality of parallel metal plates, spaced apart and internally cooled, as described above, and may function to cool the gas in the guideway 204a,b and/or condense and thereby remove vapors, e.g. tin vapors from the gas stream.

FIG. 5 further shows that the gas management system may include a regulated gas source 222 for selectively introducing, either continuously or in discrete amounts, one or more gas(ses) into the chamber 26, e.g. for ion stopping (e.g. $H_2$, (protium and/or deuterium isotopes) and/or He), and/or etching plasma generated debris deposits from surfaces in the chamber 26. such as the surface of optic 30, (e.g. HBr, HI, $Br_2$, $Cl_2$, HCl, $H_2$, or combinations thereof). It is to be appreciated that the gas source 222 may include one or more flow regulators (not shown).

FIG. 5 further shows that the gas management system may include an adjustable pump 224, e.g. turbopump or roots booster, and optional conditioner 226, (e.g. to dilute and/or scrub the gas prior to release, as described above, with reference to conditioner 114 shown in FIG. 1) for selectively removing some or all of the gas from the chamber 26, and/or other portions of the gas management system, e.g. guideways 204a,b etc. either continuously or in discreet amounts. In some cases, a heat exchanger (not shown) may be placed upstream of the pump 224 to protect the pump from high temperature gas.

Addition of fresh gas to the chamber 26 via gas source 222 and/or removal of gas via pump 224 from the chamber 26 may be performed to remove heat and thereby control the temperature within the chamber 26, and/or to remove contaminants, vapor, metal dust, etc. from the chamber 26, and/or to provide a pressure gradient in the chamber 26, e.g. to maintain a relatively large pressure between the optic 30 and irradiation region 28 and a smaller, relatively low pressure between the irradiation region 28 and the intermediate region 40.

Control of the gas source 222 and pumps 216a,b and 224 may be used to maintain a selected gas number density in a selected area of the chamber and/or pressure gradient and/or to maintain a selected flow rate through the chamber 26 and or to maintain a selected gas composition, e.g. a selected ratio of several gases, e.g. $H_2$, HBr, He, etc.

FIG. 5 further shows that one of more gas monitors 228 measuring one or more gas characteristic including, but not limited to, gas temperature, pressure, composition, e.g. He/$H_2$ ratio, HBR number density, etc. may be disposed in the chamber 26 or placed in fluid communication therewith to provide one or more signals indicative thereof to a gas management system controller 230, which, in turn, may control the pumps, regulators, etc. to maintain a selected gas temperature, pressure and/or composition. For example, a mass-spectrometer residual gas monitor may be used to measure HBR number density.

FIG. 5 also shows that the gas management system may include provisions for maintaining pre-selected flows (flow rates and/or flow directions), temperatures, gas number densities and/or contaminant levels at or near the intermediate region 40. In particular, the gas management system may be designed to meet specifications for one or more of these parameters that are developed by scanner manufacturers, etc. As shown, gas management near the intermediate region 40 may include the maintenance of a pressure below the pressure at the scanner input such that gas flows from the scanner 202 and toward the intermediate region 40. FIG. 5 also shows that the gas management system may include a gas source 232 providing a stream of gas that flows from the intermediate region 40 toward the irradiation zone 28 and a pump 234 and optional conditioner 236, as described above, for selectively evacuating the intermediate region 40.

Figure 8:
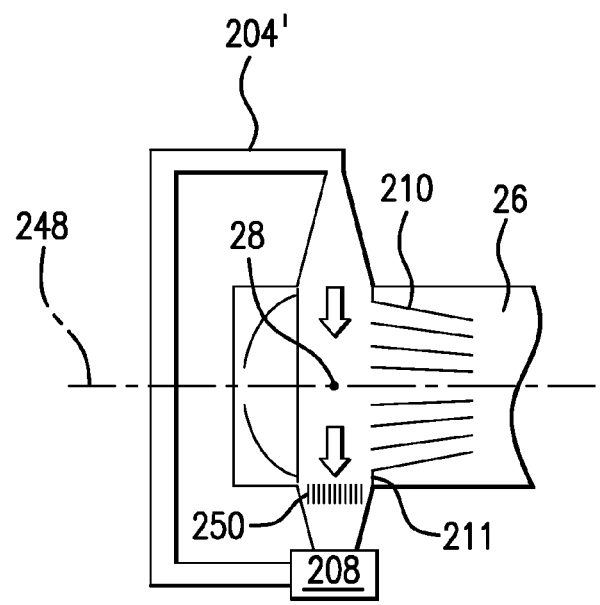
FIG. 8 shows a sectional view through a simplified, EUV light source illustrating another embodiment of an EUV light source gas management system having gas flow through the irradiation region and substantially normal to the axis of an ellipsoidal collector mirror.

FIG. 8 shows another embodiment of a gas management system for an LPP EUV light source having an enclosing structure defining a closed loop flow path, the enclosing structure having a vessel, e.g. chamber 26, in fluid communication with a guideway 204', the guideway 204' being external to the chamber 26. As shown, the flow path directs gas through the irradiation region 28 normal to the axis 248 of the optic 30 and between the optic 30, e.g. ellipsoidal collector mirror, as described above, and a multi-channel structure 210, 210', 210" (as described above and having flow restricting flange 211, as described above). Also shown, the gas management system may include a pump 208, as described above, and a heat exchanger 250, e.g. having a plurality of spaced apart, metal plates, arranged in parallel, with one or more of the plates being formed with internal passages to allow a cooling fluid for flow through. An optional filter (not shown), as described above, may also be employed in the closed loop system.

Figure 9:
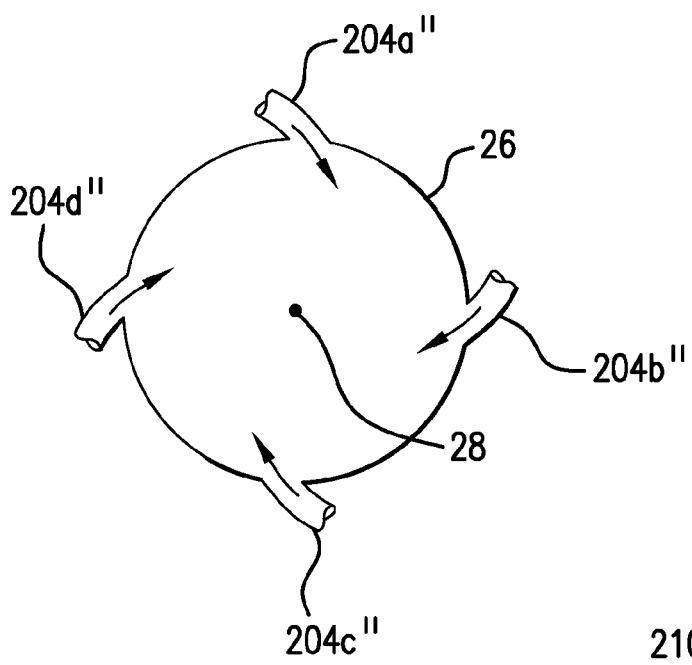
FIG. 9 shows a sectional view through a simplified, EUV light source illustrating another embodiment of an EUV light source gas management system having gas flow which creates a vortex in the plasma chamber.

FIG. 9 shows another embodiment of a gas management system for an LPP EUV light source having an enclosing structure defining a closed loop flow path in which the gas in introduced into the volume surrounding the irradiation region to create a vortex and thereby increase gas mixing and the transfer of heat from the plasma to the gas and, in some cases, minimize stagnation zones. As shown, gas is directed into the chamber 26 from one or more guideways 204a", b", c", d" with a tangential component to create a vortex within the chamber 26 and near the irradiation region 28.

Figure 10:
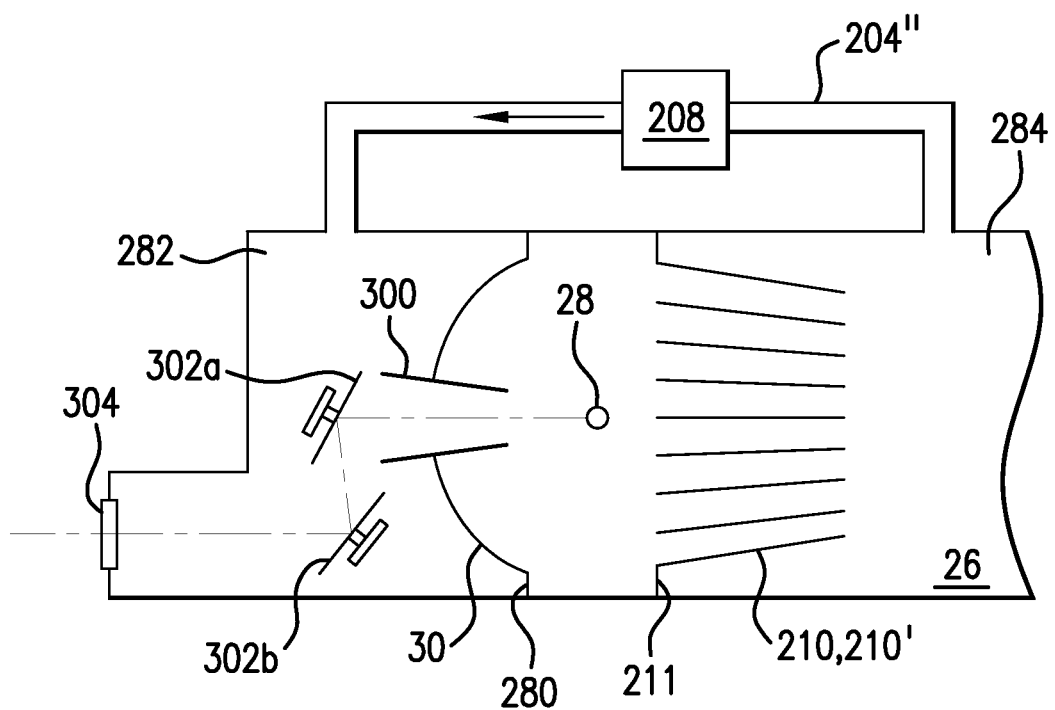
FIG. 10 shows a sectional view through a simplified, EUV light source illustrating another embodiment of an EUV light source gas management system having a shroud which extends through a central hole in the collector mirror and a flow restriction member restricting flow between the collector mirror and chamber wall.

FIG. 10 shows another embodiment of a gas management system for an LPP EUV light source having an enclosing structure defining a closed loop flow path, the enclosing structure having a vessel, e.g. chamber 26, in fluid communication with a guideway 204", the guideway 204" being external to the chamber 26. It can also be seen that a pump 208, as described above, may be provided to circulate gas through the closed loop. FIG. 10 further shows that an optic 30, e.g. ellipsoidal collector mirror, may be disposed in the chamber 26, the optic 30 formed with a central through-hole allowing a laser beam to pass through and reach an irradiation region 28. A gas flow restriction member 280 may be disposed in the chamber 26 extending from a location at or near the edge of the optic 30 to a location at or near the wall of the chamber 26 to establish compartments 282, 284 in the chamber 26. Gap(s) may be provided between the optic 30/restriction member 280 and/or restriction member 280/chamber wall, e.g. 1-3 mm to allow for expansion/contraction of the optic 30 while maintaining suitable gas flow restriction. For the device, the gas flow restriction member 280 may be integrally formed with the optic 30 or may be a separate component. With this arrangement, it can be seen that the closed-loop flow path may extend from the compartment 282 through the through-hole formed in the optic 30 and into the compartment 284. Also shown, the device may include a multi-channel structure 210, 210', 210", as described above, having flow restricting flange 211, as described above. A heat exchanger (not shown) and/or filter (not shown), both as described above, may also be employed in the closed loop system.

FIG. 10 further shows that a shroud 300 may be positioned in the through-hole which may function, among other things, to reduce the amount of plasma generated debris reaching beam delivery optics 302a,b, which, as shown, are disposed in fluid communication with the chamber 26 and irradiation region 28. For the device shown, the shroud 300 may be conical shaped having a small diameter end facing the irradiation zone. The shroud 300 may be positioned a suitable distance from the irradiation zone to prevent shroud overheating. Beam delivery optics 302a,b may be coupled to actuators (which may or may not be positioned in the compartment 282) and may be used for pulse shaping, focusing, steering and/or adjusting the focal power of the pulses delivered to the irradiation region 28 and may function to allow the laser input window 304 to be positioned at a remote location relative to the irradiation region 28 such that a line-of-sight debris path between the irradiation region 28 and window 304 is not established, thereby reducing debris deposition on the window 304. Although two reflective optics are shown, it is to be appreciated that more than two and as few as one optic may be employed. A suitable beam delivery system for pulse shaping, focusing, steering and/or adjusting the focal power of the pulses is disclosed in co-pending U.S. application Ser. No. 11/358,992 filed on Feb. 21, 2006, entitled LASER PRODUCED PLASMA EUV LIGHT SOURCE, the contents of which are hereby incorporated by reference herein. As disclosed therein, one or more beam delivery system optics may be in fluid communication with the chamber 26.

Figure 11:
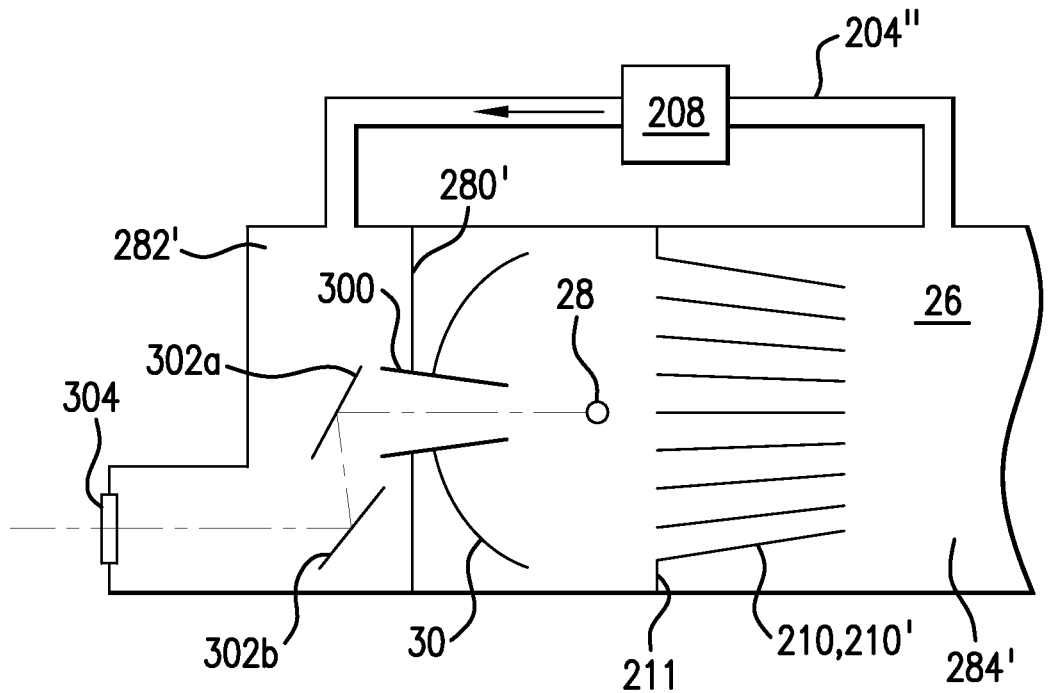
FIG. 11 shows a sectional view through a simplified, EUV light source illustrating another embodiment of an EUV light source gas management system having a shroud which extends through a central hole in the collector mirror and a flow restriction member restricting flow between the shroud and chamber wall.

FIG. 11 shows another embodiment of a gas management system for an LPP EUV light source having one or more components in common with the arrangement shown in FIG. 10 and described above, to include an enclosing structure defining a closed loop flow path, the enclosing structure having a vessel, e.g. chamber 26, in fluid communication with a guideway 204", the guideway 204" being external to the chamber 26, a pump 208, an optic 30, e.g. ellipsoidal collector mirror, may be formed with a central through-hole, a shroud 300 may be positioned in the through-hole, beam delivery optics 302a,b disposed in fluid communication with the chamber 26 and i motely located laser input window 304 .rradiation region 28 and a re For the embodiment shown in FIG. 11, a gas flow restriction member 280' may be disposed in the chamber 26 extending from a location at or near the outer surface of the shroud 300 to a location at or near the wall of the chamber 26 to establish compartments 282', 284' in the vessel. For the device, the gas flow restriction member 280' may be integrally formed with the shroud 300 or may be a separate component. With this arrangement, it can be seen that the closed-loop flow path may extend from the compartment 282' through the through-hole formed in the optic 30 and in to the compartment 284'.

Figure 11A:
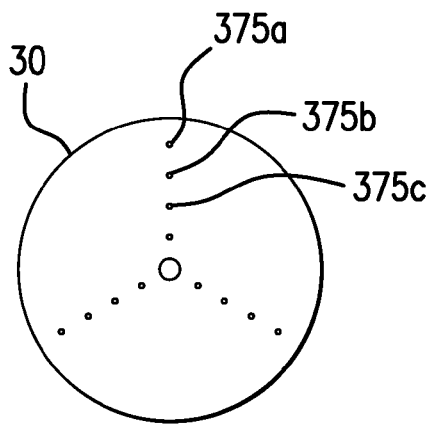
FIG. 11A shows a collector mirror formed with a plurality of through-holes for passing gas through the mirror.
Figure 11B:
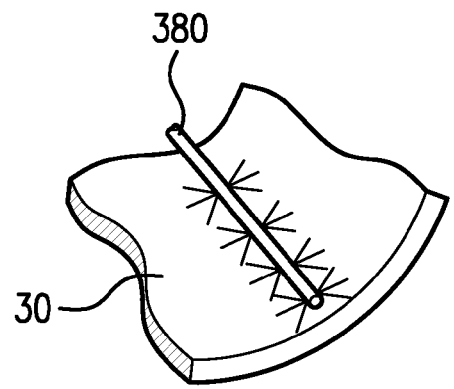
FIG. 11B shows a collector mirror having a tube running along its reflective surface to release gas onto the collector mirror surface.

FIG. 11A illustrates another possibility in which the optic 30 is formed with a plurality of relatively small through-holes, (of which through-holes 375a,b,c have been labeled), allowing gas flowing within a closed loop flow path to flow through the holes in the optic to reach the space between the optic and irradiation region 28. FIG. 11B illustrates yet another possibility in which one or more tube(s) 380 are positioned near, e.g. within about 1-2 mm, of the reflective surface of the optic 30, with each tube formed with a plurality of relatively small holes to release gas onto the surface of the optic 30. Either of these configurations may be employed with or without gas flow through the central through-hole (described above). For these configurations, placement of the tubes and/or through-holes may be selected to correspond to light paths which are unusable by the scanner, due, e.g. to obstructions in the scanner and/are otherwise blocked by other structures, e.g. debris mitigation structures, multi-channel structures, etc.

Figure 12:
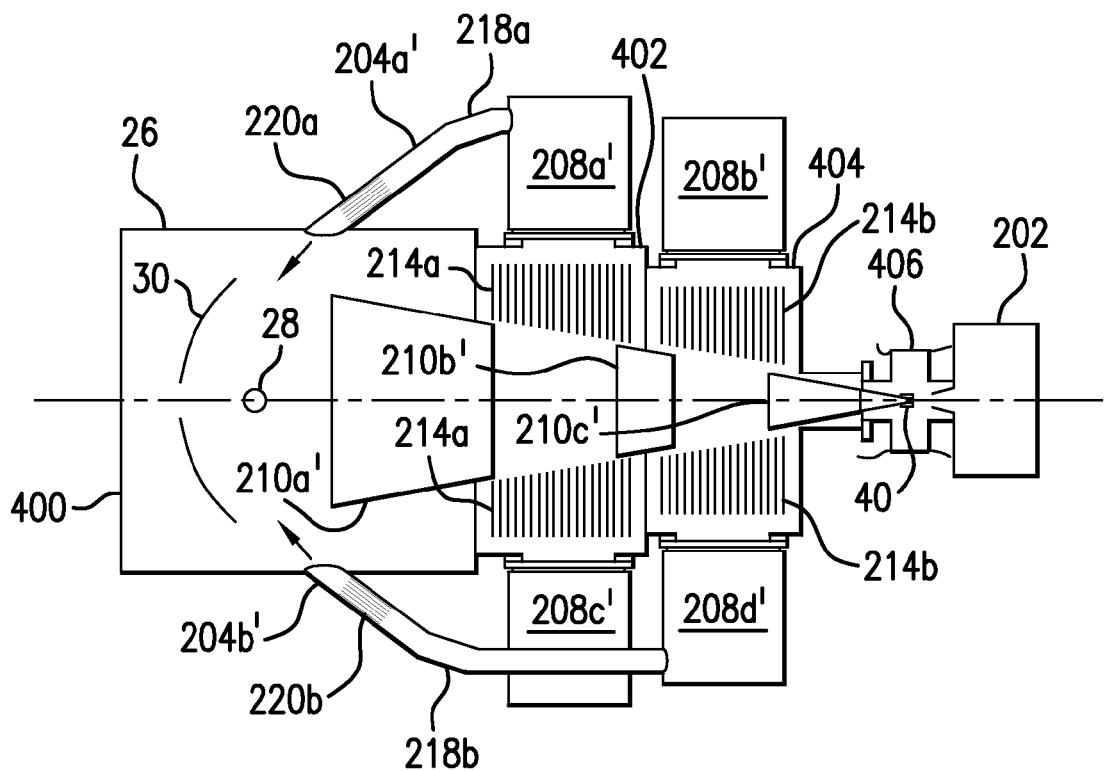
FIG. 12 shows a sectional view through a simplified, EUV light source illustrating another embodiment of an EUV light source gas management system having a plasma irradiation module, two pump/heat transfer modules and a scanner interface module.

FIG. 12 shows another embodiment of a gas management system for an LPP EUV light source having an enclosing structure defining a closed loop flow path, the enclosing structure having a vessel, e.g. chamber 26, in fluid communication with a guideways 204a', 204b', the guideways 204a', 204b' being external to the chamber 26, as described above. As shown, the chamber 26 may include a plasma irradiation module 400, pump/heat exchanger module 402, pump/heat exchanger module 404 and scanner interface module 406. For the device, the chamber 26 may consist of separate modules assembled together or one integrally formed unit.

For the device shown, an optic 30 may be positioned in the chamber 26, e.g. an ellipsoidal collector mirror formed with a central through-hole to allow a laser beam from a laser source (not shown) to pass through and reach an irradiation region 28. Also shown, the optic may focus light from the irradiation region 28 to an intermediate region 40, generating a cone of EUV light extending through the chamber 26 having an apex at the intermediate region 40.

FIG. 12 further shows that pump/heat exchanger module 402 includes pumps 208a',b', as described above, and heat exchanger 214a, and pump/heat exchanger module 404 includes pumps 208c' d', as described above and heat exchanger 214b. For the device, and heat exchangers 214a,b may consist of a plurality of spaced apart, parallel, annularly shaped metal plates that extend around the EUV light cone and with each plate individually sized to extend to an inner circular edge that is near or at the edge of the EUV light cone (defined by the ellipsoidal optic 30), as shown. One, some or all of the plates may be formed with one or more internal passages to pass a heat exchange fluid, e.g. water, to cool each plate. The heat exchangers 214a,b may function to cool gas flowing through the exchanger 214a,b and/or to condense target material vapors that may undesirable absorb EUV radiation, e.g. tin vapor when tin is used as a target material. Once cooled, the gas may pass through pumps 208a'-d', which may be, for example, turbo-pumps and/or roots-type boosters, and thereafter be directed through external guideways 204a',b' to locations in the a plasma irradiation module 400. As shown, a space may be provided between the outer diameter of the heat exchanger plates and the pump to form a vacuum cavity. For the device, the plates may nearly fill the entire length of the chamber, thus resistance of such structure to gas flow may be fairly small, not limiting the pumping speed of the pumps. At the same time, the working area of the plates will be large to provide high efficiency for gas cooling.

It is to be appreciated that one or more flow regulators (not shown) may be provided, e.g. one regulator near each pump, to balance flow throughout the gas management system. For the device, one or both of the guideways 204a',b' may include an optional filter 218a,b (as described above) and/or an additional, optional heat exchanger 220a,b (as described above).

Continuing with FIG. 12, it can be seen that a multi-channel structure 210a' is positioned along the gas flow path between the plasma irradiation module 400 and pump/heat exchanger module 402, a second multi-channel structure 210b' is positioned along the gas flow path between the pump/heat exchanger module 402 and the pump/heat exchanger module 404 and a third multi-channel structure 210c' is positioned along the gas flow path between the pump/heat exchanger module 404 and the scanner interface module 406. For the device shown, each multi-channel structure may include a plurality of concentric, conical shaped vanes (see FIG. 5B) plate shaped vanes (see FIG. 5C) and/or radially oriented vanes (see FIG. 7) that are arranged to allow light to travel from the optic 30 to the intermediate region 40 and may be designed to minimize EUV light obscuration. In addition, vane location may be selected to correspond to light paths which are unusable by the scanner 202, due, e.g. to obstructions in the scanner. Each multi-channel structure may be positioned in an opening formed in the respective module housing, as shown, to restrict flow between the multi-channel structure and respective module housing.

While the particular embodiment(s) described and illustrated in this patent application in the detail required to satisfy 35 U.S.C. §112 are fully capable of attaining one or more of the above-described purposes for, problems to be solved by, or any other reasons for or objects of the embodiment(s) above described, it is to be understood by those skilled in the art that the above-described embodiment(s) are merely exemplary, illustrative and representative of the subject matter which is broadly contemplated by the present application. Reference to an element in the following Claims in the singular is not intended to mean nor shall it mean in interpreting such Claim element "one and only one" unless explicitly so stated, but rather "one or more". All structural and functional equivalents to any of the elements of the above-described embodiment(s) that are known or later come to be known to those of ordinary skill in the art are expressly incorporated herein by reference and are intended to be encompassed by the present Claims. Any term used in the Specification and/or in the Claims and expressly given a meaning in the Specification and/or Claims in the present application shall have that meaning, regardless of any dictionary or other commonly used meaning for such a term. It is not intended or necessary for a device or method discussed in the Specification as an embodiment to address or solve each and every problem discussed in this application, for it to be encompassed by the present Claims. No element, component, or method step in the present disclosure is intended to be dedicated to the public regardless of whether the element, component, or method step is explicitly recited in the Claims. No claim element in the appended Claims is to be construed under the provisions of 35 U.S.C. §112, sixth paragraph, unless the element is expressly recited using the phrase "means for" or, in the case of a method claim, the element is recited as a "step" instead of an "act".

What is claimed is:

1. A light source comprising:
   a system for generating a train of light pulses and delivering the light pulses into a chamber along a beam path, the system including a gain medium for amplifying light of a source wavelength;
   an optic within the chamber defining a first focus at an irradiation region and a second focus at an intermediate region;
   a target material delivery system delivering a target material to the irradiation region; and
   a multichannel structure within the chamber and disposed between the irradiation region and the intermediate region and including a plurality of conical shaped vanes.

2. The light source of claim 1, wherein the plurality of conical shaped vanes allow light to travel from the optic to the intermediate region.

3. The light source of claim 1, wherein the plurality of conical shaped vanes condense target material vapors.

4. The light source of claim 1, wherein the plurality of conical shaped vanes are maintained at a temperature above the melting point of the target material.

5. The light source of claim 1, wherein the target material includes tin.

6. The light source of claim 1, wherein the plurality of conical shaped vanes are maintained at a temperature below the melting point of the target material.

7. The light source of claim 1, further comprising one or more radial members configured to support the plurality of conical shaped vanes.

8. The light source of claim 1, wherein the optic comprises a collector mirror.

9. The light source of claim 8, wherein the collector mirror is formed from a truncated ellipsoid.

10. The light source of claim 8, wherein the collector mirror includes a through hole to allow the light pulses generated by the system to pass through the optic to reach the irradiation region.

11. The light source of claim 1, wherein the plurality of conical shaped vanes are concentric.

12. A chamber system comprising:
    a multichannel structure supported within a chamber and disposed between an irradiation region and an intermediate region, defined by an optic that includes a first focus at the irradiation region and a second focus at the intermediate region, the multichannel structure comprising a plurality of concentric conical shaped vanes that are arranged to allow a train of light pulses generated from a system to travel from the optic to the intermediate region.

* * * * *